United States Patent [19]

Ansell et al.

[11] Patent Number: 4,712,077
[45] Date of Patent: Dec. 8, 1987

[54] TRISTATE PHASE-LOCK LOOP PREVENTS FALSE LOCK

[75] Inventors: Henry G. Ansell, Exeter Township, Berks County, Pa.; Jeffrey H. Saunders, Methuen, Mass.

[73] Assignee: American Telephone and Telegraph Company, AT&T Bell Labs, Murray Hill, Pa.

[21] Appl. No.: 945,032

[22] Filed: Dec. 22, 1986

[51] Int. Cl.⁴ .............................................. H03L 7/10
[52] U.S. Cl. ...................................... 331/25; 331/10; 375/120
[58] Field of Search ................... 331/1 A, 10, 17, 25; 375/120

[56] References Cited

U.S. PATENT DOCUMENTS 4,495,473  1/1985  Treise ............................ 331/25 X
4,520,319  5/1985  Baker ............................ 331/25 X
4,565,975  1/1986  Gegner et al. .................. 331/25 X Primary Examiner—Eugene R. LaRoche
Assistant Examiner—Robert J. Pascal
Attorney, Agent, or Firm—Richard B. Havill

[57] ABSTRACT

A phase-lock loop includes a tristate phase detector, a filter and a voltage-controlled oscillator connected in a loop for regenerating clock signals in response to a sequence of data signals applied to the input terminal of the tristate phase detector and the loop. The tristate phase detector opens its output lead whenever a zero is applied to the input terminal of the loop. A resistor is interposed between the tristate phase detector and the loop filter to clamp excursions of a control signal, causing the filter to produce a consistent tuning control signal and forcing the voltage-controlled oscillator to oscillate at a frequency within a preselected frequency range independent of the ones density in the digital sequence applied to the input terminal of the loop.

12 Claims, 10 Drawing Figures

TRISTATE PHASE-LOCK LOOP PREVENTS FALSE LOCK

BACKGROUND OF THE INVENTION

This invention relates to a phase-lock loop including a tristate phase detector and is more particularly described as a tristate phase-lock loop arranged to avoid locking on the wrong frequency when a long string of zeros, or a sequence containing sparse ones, is received.

In a T1 transmission system, information is encoded as ones and zeros. Ones are represented by alternating positive and negative pulses. Zeros are represented as zero volts. This T1 signal format is called a bipolar alternate mark inversion (AMI) signal.

Along the cable, regenerators are used to boost the signals and improve the transmission characteristics of the system. Each regenerator receives the sequence of digital signals, amplifies, reshapes, and retimes the sequence of digital signals before retransmitting them along the cable. Retiming is accomplished by a clock signal which is generated in the regenerator in response to information contained in the received sequence of digital signals. The regenerator function also is used at the receiving terminals of a T1 transmission system.

A T1 terminal includes a receive converter device for extracting a 1.544 MHz clock signal from the received sequence of digital signals. Desired, or acceptable, clock signals have a frequency which is within a narrow range of frequencies centered at 1.544 MHz. The receive converter uses a phase-lock loop, including a phase detector, a low pass loop filter and a voltage-controlled oscillator (VCO), to recover the clock signal. The voltage-controlled oscillator generates the recovered clock signal at a frequency that varies in response to the magnitude of a tuning control signal voltage applied to the tuning control terminal of the VCO. The phase detector compares the received sequence of digital signals with the VCO clock output signal and produces a control signal having a magnitude which is proportional to the difference between the phases of the received sequence of digital signals and of the VCO clock output signal. The loop filter smooths the control signal into the tuning control signal before it is applied to the tuning control terminal of the VCO.

In circumstances in which the received sequence of digital signals includes all ones, the energy in the rectified signal spectrum is concentrated substantially more at the frequency of 1.544 MHz than at any other frequency. Automatic recovery of the clock signal at 1.544 MHz is easy under such circumstances.

When the received sequence of digital signals includes sparse ones, energy in the rectified signal spectrum is spread into several different frequencies. Energy is more concentrated at frequencies such as 1.16 MHz and 1.352 MHz than at 1.544 MHz when the sparse ones are being received. Accordingly, there is ambiguity in automatically recovering the correct clock frequency, and the VCO clock output signal frequency will not necessarily lock-on the desired 1.544 MHz. Instead the phase-lock loop may lock on a frequency other than close to 1.544 MHz.

Jitter may cause bit errors in the retimed digital signals. If the resulting bit error rate rises too high, it causes a severe degradation of the transmission system performance.

To avoid jitter, a tristate phase detector arrangement is used in the receive converter for opening the switch in the output lead of the tristate phase detector from the loop filter when each zero is received. When that switch is opened, the VCO is controlled by the preexisting tuning control voltage. Once lock is achieved with the tristate phase detector arrangement, the preexisting tuning control voltage causes the VCO to continue producing an output clock signal at the frequency where it is locked even though a string of zeros is received. The two pass loop filter is designed to retain its charge and, therefore, the preexisting control voltage for a time equal to the duration required for the occurrence of the maximum allowable string of consecutive zeros. If the VCO has been locked on 1.544 MHz, it will continue to produce that frequency because the tristate phase detector output is open circuited while zeros are being received. If, on the other hand, the VCO has already been locked on a different frequency because an undesirable tuning control voltage exists, then it will continue to produce that different frequency while sparse ones are being received.

This presents no particular problem while the T1 system is operating under normal conditions because once the phase-lock loop is locked to a frequency within the acceptable range near 1.544 MHz, the system will remain locked on that frequency. However, a problem may arise when the T1 system is first started up or when the T1 system has been operated on standby states and is switched into active service. At such times, the VCO tuning control signal voltage may not be at a value for causing the VCO to produce the clock output near 1.544 MHz. When the tristate phase detector output is opened in response to received zeros while the VCO tuning control signal voltage is at an undesired magnitude, the tuning control signal voltage stays at the wrong voltage, and the clock output from the VCO continues to be falsely locked at a frequency substantially different than the desired 1.544 MHz. This is called the false lock problem.

When the VCO produces clock output at a frequency other than a frequency with the desired range near 1.544 MHz, the regenerator will not operate, and the sequence of digital signals will not be processed at all.

This problem of false locking might be overcome by simply reducing the pull-in, or acquisition, range of the phase-lock loop; however, it is likely that such a solution will undesirably limit the amount of VCO drift, caused by temperature changes and component aging, which can be accommodated by the phase-lock loop during the lifetime of operation of the T1 system.

The problem also might be overcome by preventing the output switch in the tristate phase detector from switching open upon the receipt of every input zero. Instead the output switch can be left closed and input zeros counted until there are three or four zeros in an eight bit word. At that time the output switch of the tristate phase detector would be opened for every zero until the end of the word.

SUMMARY OF THE INVENTION

The false lock problem is overcome additionally by a phase-lock loop including a tristate phase detector, a filter and a voltage-controlled oscillator connected in a loop for regenerating clock signals in response to a sequence of data signals applied to the input terminal of the tristate phase detector and the loop. The tristate phase detector opens its output lead whenever a zero is applied to the input terminal of the loop. A resistor is interposed between the tristate phase detector and the loop filter to clamp excursions of a control signal, causing the filter to produce a consistent tuning control signal voltage and forcing the voltage-controlled oscillator to oscillate at a frequency within a preselected frequency range independent of the ones density in the digital sequence applied to the input terminal of the loop.

BRIEF DESCRIPTION OF THE DRAWINGS

A better understanding of the invention may be derived from the subsequent detailed description when that description is read with reference to the drawing wherein.

DETAILED DESCRIPTION

Figure 1:
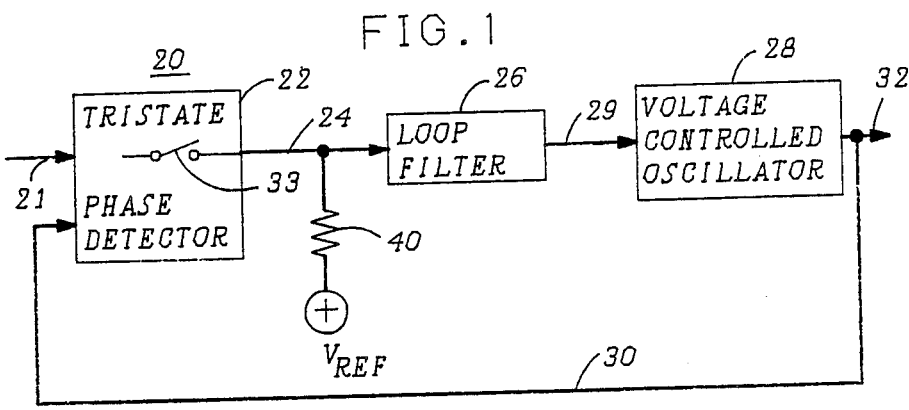
FIG. 1 is a block diagram of a tristate phase-lock loop arranged in accordance with the invention.

Referring now to FIG. 1, there is shown a clock recovery phase-lock loop 20 for use in the receiving terminals of a T1 digital transmission system. A sequence of digital signals is applied to an input terminal 21 which is the input for both the phase-lock loop 20 and a tristate phase detector 22. The rest of the loop includes a low pass loop filter 26, a voltage-controlled oscillator 28 and leads 24, 29 and 30 interconnecting the detector, the filter and the oscillator. Clock signals, produced by the oscillator 28 and the phase-lock loop, occur on an output terminal 32.

Figure 4:
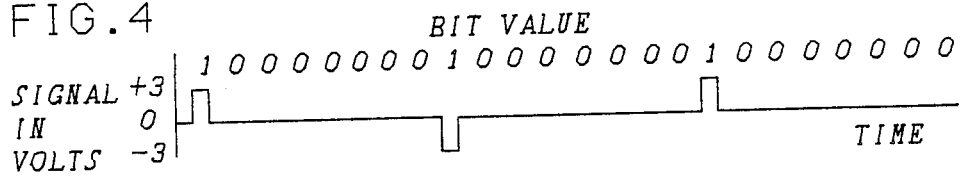
FIG. 4 is a graph of another sequence of digital signals having sparse ones.

Many combinations of digital sequences may be applied to the input terminal 21. The arrangement of FIG. 1, unlike prior art arrangements, responds to all of those digital sequences by producing a stable recovered clock signal which always has a frequency within the desired range for operating the transmission system with an acceptable bit error rate. Two of the many combinations of input sequences of digital signals are shown in FIGS. 2 and 4, as contrasting examples.

Figure 2:
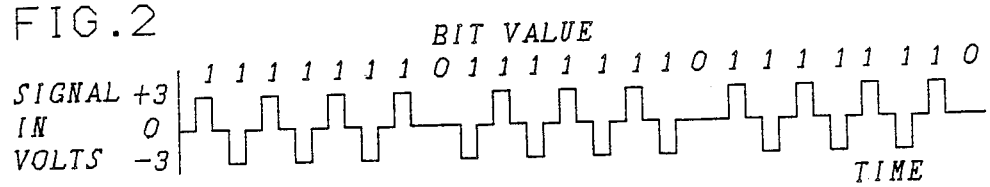
FIG. 2 is a graph of a sequence of digital signals having many ones.

First of all consider the digital sequence of FIG. 2. There the digital sequence, represented by the signal, is a repetitive sequence of seven ones out of eight pulses. The ones are represented by alternating pulses of positive and negative polarity. The zeros are shown at zero volts. The representative signal is called a bipolar alternate mark inversion signal. Because the digital sequence is nearly all ones, i.e., it has a high density of ones, there is a very strong fundamental frequency component at half the pulse rate.

Figure 3:
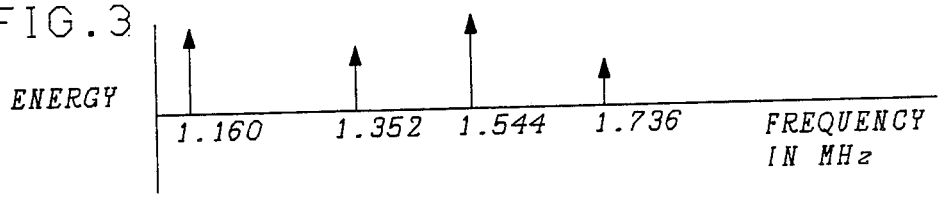
FIG. 3 is a graph of an energy spectrum for the rectified signal of FIG. 2.

FIG. 3 shows that the energy spectral distribution for the rectified sequence of digital signals of FIG. 2 is substantially concentrated at the frequency of 1.544 MHz. Other lower levels of energy are shown at 1.16 MHz, 1.352 MHz and 1.736 MHz. This sequence of digital signals, shown in FIG. 2, is easily detected for producing an output clock signal at 1.544 MHz because of the high concentration of energy at that frequency. The exemplary arrangement of FIG. 1 produces good clock signals in response to the sequence of digital signals shown in FIG. 2.

In actual operation of a T1 carrier system with the sequence of input digital signals of FIG. 2, the switch shown in the tristate phase detector is closed except for the every eighth time slot. A relatively level control signal produced on the lead 24 is smoothed by the low-pass loop filter 26 and is applied as a tuning control signal, or tuning control voltage, over the lead 29 to a tuning control input of the voltage-controlled oscillator 28. The magnitude of the tuning control voltage causes the voltage-controlled oscillator to produce an output clock signal on the output terminal 32 at a frequency in the desired range of frequencies near 1.544 MHz. This output clock signal is used for sampling the input sequence of digital signals during the regeneration process in the terminal regenerator and is applied over the lead 30 to a feedback terminal of the tristate phase detector 22.

When applied to the feedback terminal of the tristate phase detector, the clock signal on the lead 30 is substantially in phase with the input sequence of digital signals of FIG. 2 and causes little, if any, change in the magnitude of the tuning control signal on the lead 29. Thus the phase-lock loop of FIG. 1 produces the clock signal at a frequency within the desired range of frequencies near 1.544 MHz in response to the substantial concentration of energy at 1.544 MHz in the input sequence of digital signals.

When more zeros are intermingled with the ones or when nearly all zeros are transmitted, the tristate phase-lock loop 20 of FIG. 1 operates somewhat differently.

Referring now to FIG. 4, there is shown another sequence of digital signals which may be applied to the input terminal 21 of FIG. 1. This digital sequence of FIG. 4 contains a single one in every eight time slots and thus has a low density of ones. The spectral energy contained in the digital sequence of FIG. 4 is spread differently across the band of frequencies than the energy of the digital sequence of FIG. 2.

Figure 5:
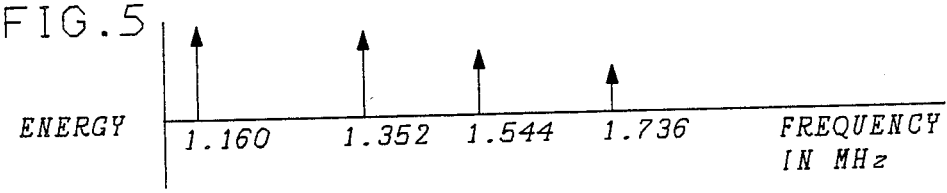
FIG. 5 is a graph of an energy spectrum for the rectified signal of FIG. 4.

FIG. 5 shows the energy spectral distribution for the rectified digital sequence of FIG. 4. The energy is concentrated significantly more at the frequencies 1.160 MHz and 1.352 MHz than at the desired 1.544 MHz. Regardless of those high concentrations of energy at the wrong frequencies, the loop 20 of FIG. 1 is arranged to lock on the desired frequency of 1.544 MHz for the single one out of eight digital sequence. Other low density of ones digital sequences also cause the loop 20 to lock on the desired frequency of 1.544 MHz.

The tristate phase detector 22 is an ordinary phase detector having an on/off switch 33 in the output lead. When a one or a sequence of ones is applied to the digital sequence input terminal 21, the switch 33 is closed so that the signal produced by the detector 22 is applied through the switch 33 to the lead 24, as a control signal. The loop filter 26 smoothes the control signal into a tuning control signal, or tuning control voltage, which is produced on the lead 29 and is applied to the voltage-controlled oscillator 28. When any zero is applied to the digital sequence input terminal 21, the switch 33 is opened.

In the arrangement of FIG. 1, a reference voltage $V_{REF}$ is coupled through a damping resistor 40 to the lead 24, as a supplementary control signal for the input to the loop filter 26. Since the switch 33 is open while a zero is being applied to the digital sequence input terminal 21, the supplementary control signal voltage on the lead 24 moves toward the reference voltage $V_{REF}$. $V_{REF}$ is selected to produce on the lead 29 a tuning control signal that tunes the voltage-controlled oscillator to operate at a frequency within the desired range near 1.544 MHz. Thus no matter what control signal voltage had existed on the lead 24 before the zero is applied to the digital sequence input terminal, the supplementary control signal on lead 24 now moves the tuning control signal on the lead 29 to a voltage which will tune the oscillator 28 to produce a clock signal at a frequency near the desired frequency of 1.544 MHz while the zero is applied to the digital sequence input terminal 21.

Figure 6:
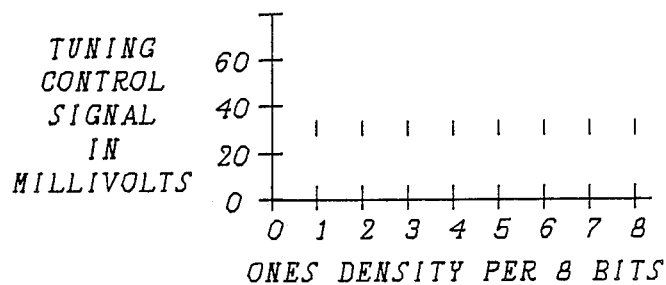
FIG. 6 is a graph showing the tuning control signal voltage, as a function of the input ones density, for the tristate phase-lock loop arrangement of FIG. 1.

As shown in FIG. 6 by several short vertical lines, the tuning control signal voltage on the lead 29 of FIG. 1 is independent of the input ones density and remains in a narrow band of voltages for controlling the frequency of oscillation. That band of tuning control signal voltages will operate the voltage-controlled oscillator at the frequencies within the desired band of frequencies near 1.544 MHz.

Thus the tristate phase detector 22 solves the jitter problem by helping the phase-lock loop 20 retain a relatively constant clock output frequency while the tristate phase detector is receiving a long string of zeros, or a low density of ones in a digital sequence. At the same time, however, the reference voltage is forcing the tuning control signal to the correct voltage for operating the voltage-controlled oscillator 28 at the desired frequency.

Figure 7:
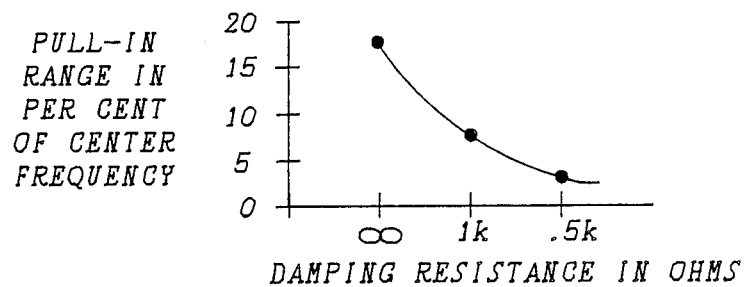
FIG. 7 is a plot of the pull-in range vs. a damping resistance for the phase-lock loop arrangement of FIG. 1.

Refer now to FIG. 7. The curve shows the relationship between the resistance of the damping resistor 40 and the pull-in range of the tristate phase-lock loop 20 of FIG. 1. As shown in FIG. 7 the pull-in range decreases as the resistance of the resistor 40 decreases. A range of acceptable values for the damping resistor 40 is determined by selecting a pull-in range from FIG. 7 which will exclude false lock frequencies shown in FIGS. 3 and 5 while accommodating for VCO drift caused by temperature and component changes.

DISCUSSION OF PRIOR ART

Figure 8:
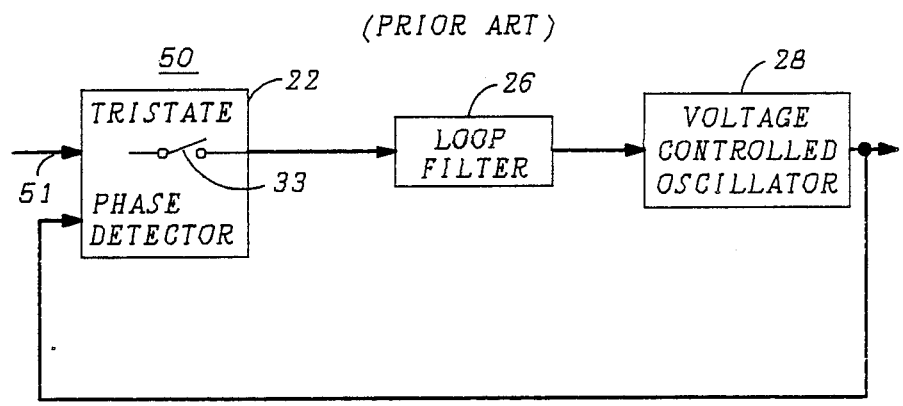
FIG. 8 is a block diagram of a prior art tristate phase-lock loop.

Referring now to FIG. 8, there is shown a prior art clock recovery phase-lock loop 50 which has been used in the terminals of T1 digital transmission systems. This phase-lock loop 50 may lock on the energy at either of the false lock frequencies 1.160 MHz and 1.352 MHz shown in FIG. 5 as well as on the desired 1.544 frequency. Such false locking is most likely to occur when the phase-lock loop operation is starting up or when the system has been operating on standby status and is switched into active service.

The tristate phase detector 22 includes a switch which is closed when a one is applied to the digital sequence input terminal 51. Also the switch is open when any zero is applied to the digital sequence input terminal 51. Since the loop filter 26 is designed to retain charge for the maximum allowable string of consecutive zeros, the tuning control signal, which is produced by the loop filter 26 and applied to the voltage-controlled oscillator 28, will cause that oscillator to produce a clock signal at the frequency which existed while the switch was previously closed.

The operation of the circuit configuration of FIG. 8 in response to a sequence of bits containing a low ones density contrasts to the operation of the arrangement of FIG. 1. The prior art arrangement of FIG. 8 does not include the reference voltage $V_{REF}$ and the damping resistor 40 of FIG. 1. Without the reference voltage and the damping resistor, the prior art arrangement of FIG. 8 retains the last control signal voltage whenever an input zero opens the switch 33. In the operation of the phase-lock loop 50, that control signal voltage may be determined by energy at a frequency other than the desired 1.544 MHz. Then the prior art phase-lock loop can lock on an undesirable frequency, such as 1.352 MHz. This is a so-called false lock condition, or a lock on the wrong frequency.

Figure 9:
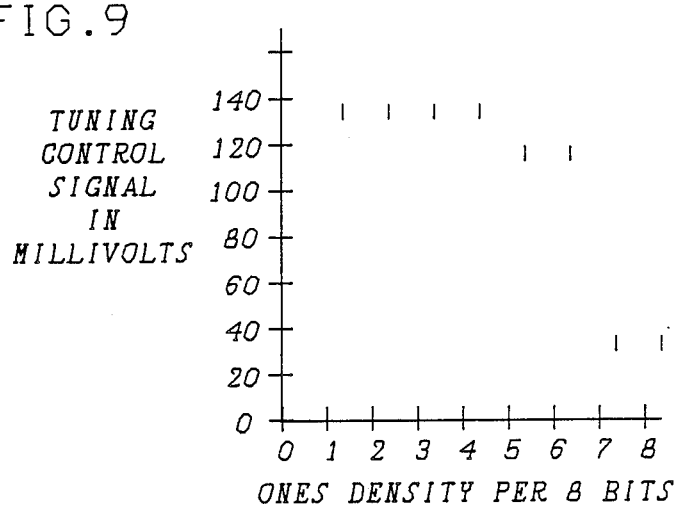
FIG. 9 is a graph showing the tuning control signal, voltage as a function of the input ones density, for the prior art loop tristate phase-lock loop arrangement of FIG. 8.

Referring now to FIG. 9, there is shown the control signal voltage characteristics for operation of the loop 50 of FIG. 8. A series of short vertical lines represents the range of tuning control signal voltages which occur as a result of the false lock, or stuck tuning voltage, problem. With ones densities of one-out-of-eight to six-out-of-eight, the tuning control signal voltage is in the range of 130 mv to 120 mv. In that range the oscillator 28 of FIG. 1 will operate at 1.352 MHz, rather than the desired 1.544 MHz.

Once the ones density increases to seven-out-of-eight and eight-out-of-eight, the tuning control signal voltage reduces to 30 mv, the level at which the oscillator 28 operates within the desired range of frequencies near 1.544 MHz.

DETAILED DESCRIPTION CONTINUED

Advantageously, the new arrangement of FIG. 1 with the selected reference voltage $V_{REF}$ coupled through the resistor 40 to produce the supplementary control signal on the lead 24 avoids the false lock problem because the resulting tuning control signal voltage on the lead 29 remains at the voltage required to operate the oscillator 28 within the desired range of frequencies near 1.544 MHz regardless of the ones density in the input digital sequence.

Since the clock recovery phase-lock loop 20 of FIG. 1 produces the desired frequency of 1.544 MHz regardless of the ones density in the received sequence of digital signals, the transmission line as a whole can operate as it is supposed to operate even when the ones density is low while the system is starting up or while a standby system is being switched into service.

Figure 10:
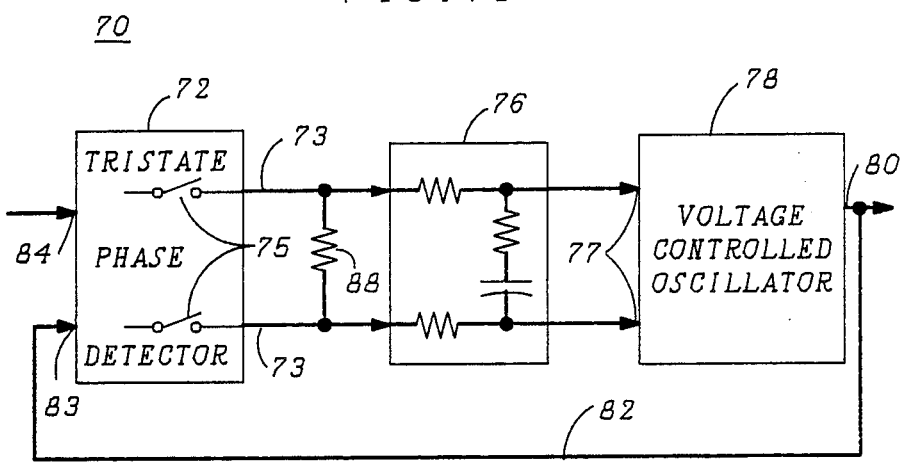
FIG. 10 is a block diagram of another embodiment of the tristate phase-lock loop arrangement in accordance with the invention.

Referring now to FIG. 10, there is shown another phase-lock loop 70, which has a simplified false lock prevention arrangement. The loop 70 includes a tristate phase detector 72 that has balanced outputs 73. Each output lead is connected with an output switch 75 within the tristate phase detector 72. Signals on the outputs 73 are balanced, i.e., positive polarity excursions on one lead are equal to negative polarity excursions on the other lead. The balanced outputs 73 are interconnected with balanced inputs of a balanced loop filter 76 which has balanced output leads interconnected to balanced input terminals 77 of a voltage-controlled oscillator 78. A voltage difference between the input terminals 77 controls the frequency of oscillation of the oscillator 78. An output terminal 80 of the voltage-controlled oscillator 78 produces output clock signals for the loop 70. Those output signals also are fed back by way of a lead 82 to a feedback input terminal 83 of the balanced output phase detector 72.

In operation a sequence of data signals is applied to a data input terminal 84 of the tristate phase detector 72. The data sequence includes zeros and ones. When a zero is applied to the data input terminal 84, the output switches 75 are open. Alternatively when a one is applied to the data input terminal 84, those output switches 75 are closed.

Whether the switches 75 are closed or opened, a balanced control signal always is present between the balanced outputs 73. Excursions of the control signal voltage on the balanced outputs 73 always have opposite polarities and equal magnitudes. When the VCO is operating at the designed frequency, the differential control signal voltage between the outputs 73 is zero. Typically when the phase-lock loop 70 is locked to the input sequence of data pulses, a measurable differential control signal voltage exists between the outputs 73.

A resistor 88 is connected between the balanced outputs 73 to clamp the differential control signal voltage between the output leads 73 within a range of magnitudes, which assures that the phase-lock loop 70 acquires lock only in the desired frequency range. During acquisition of lock, the circuit may tend to lock on an undesirable frequency. In that event, the voltages on the balanced outputs 73 start to swing to opposite polarity voltages from each other. As a result of the voltage difference, a current is established in the resistor 88 for clamping the differential voltage excursion within an acceptable control signal range.

The differential control signal voltage on the outputs 73 is smoothed by the balanced filter 76 into a differential tuning control signal, or tuning control voltage, on the leads 77. This differential tuning control signal is within the acceptable range and is applied to the voltage-controlled oscillator 78 for determining the actual frequency of oscillation, which will be within the desired frequency range. By reference to FIG. 9, one can determine that the differential tuning control signal excursions should be within the acceptable tuning control signal range and, therefore, should be limited to less than 100 millivolts for preventing false locking. The actual resistance value of the resistor 88 is determined in part by the output impedance of the tristate phase detector 72 and in part by the desired pull-in range of the phase-lock loop 70.

The foregoing describes some embodiments of applicant's advantageous invention. The described embodiments together with other embodiments, which are obvious in view thereof, are considered to be within the scope of the appended claims.

What is claimed is:

1. A phase-lock loop comprising
   a tristate phase detector having a data input terminal, a feedback terminal and an output terminal;
   a filter having input and output terminals, the filter input terminal being connected with the output terminal of the tristate phase detector for receiving a control signal while ones are being applied to the data input terminal and being disconnected from the output terminal of the tristate phase detector while zeros are being applied to the data input terminal;
   a voltage-controlled oscillator having a tuning control signal input terminal and regenerating a clock signal within a desired frequency range independent of the ones density applied to the data signal input terminal, the tuning control signal input terminal being connected with the output terminal of the filter for receiving a tuning control signal;
   means for coupling the clock signal from the clock output terminal to the feedback terminal of the tristate phase detector; and
   an impedance coupling a reference voltage to the input terminal of the filter as a supplementary control signal for clamping the tuning control signal and thereby forcing the oscillator to oscillate at a frequency within the desired frequency range independent of the ones density in the digital sequence applied to the data signal input terminal of the phase-lock loop.

2. A phase-lock loop, in accordance with claim 1, wherein
   the impedance is a resistor that clamps the magnitude of the control signal and thereby the tuning control signal within a range which assures that the phase-lock loop acquires lock only at acceptable frequencies.

3. A phase-lock loop, in accordance with claim 1, wherein
   the impedance is a resistor that clamps the magnitude of the control signal and thereby the tuning control signal within a range that is wide enough to accept expected frequency variations of the input data signal and drift of the voltage-controlled oscillator.

4. A phase-lock loop, in accordance with claim 3, wherein
   the resistor further clamps the magnitude of the tuning control signal within a range which assures that the phase-lock loop acquires lock only at acceptable frequencies.

5. A phase-lock loop comprising
   a tristate phase detector having a data signal input terminal, a feedback terminal and balanced output terminals;
   a balanced input voltage-controlled oscillator having a phase-lock loop output terminal;
   a balanced filter interposed between the balanced output terminals of the tristate phase detector and the balanced input of the voltage-controlled oscillator;
   a feedback path interconnecting the phase-lock loop output terminal to the feedback terminal of the tristate phase detector; and
   an impedance connected between the balanced output terminals of the tristate phase detector for clamping a balanced tuning control signal within a range for forcing the voltage-controlled oscillator to regenerate an output clock having a frequency within a desired range independent of the ones density in a digital sequence applied to the data signal input terminal.

6. A phase-lock loop, in accordance with claim 5, wherein
   the impedance is a resistor that clamps the magnitude of the balanced tuning control signal within a range which assures that the phase-lock loop acquires lock only within the desired frequency range.

7. A phase-lock loop, in accordance with claim 5, wherein the impedance is a resistor that clamps the magnitude of the balanced tuning control signal within a range that is wide enough to accept expected frequency variations of the input data signal and drift of the voltage-controlled oscillator.

8. A phase-lock loop, in accordance with claim 7, wherein
the resistor further clamps the magnitude of the balanced tuning control signal within a range which assures that the phase-lock loop acquires lock only at acceptable frequencies.

9. A phase-lock loop comprising
a tristate phase detector having a data signal input terminal, a feedback terminal and balanced output terminals;
a balanced input voltage-controlled oscillator having a phase-lock loop output terminal;
a balanced filter interposed between the balanced output terminals of the tristate phase detector and the balanced input of the voltage-controlled oscillator;
a feeback path interconnecting the phase-lock loop output terminal to the feedback terminal of the tristate phase detector; and
an impedance connected between the balanced output terminals of the tristate phase detector for clamping a balanced tuning control signal within a range and driving the tuning control signal to a value for forcing the voltage-controlled oscillator to regenerate an output clock having a frequency within a desired range independent of the ones density in a digital sequence applied to the data signal input terminal.

10. A phase-lock loop, in accordance with claim 9, wherein
the impedance is a resistor that clamps the magnitude of the balanced tuning control signal within a range which assures that the phase-lock loop acquires lock only within the desired frequency range.

11. A phase-lock loop, in accordance with claim 9, wherein
the impedance is a resistor that clamps the magnitude of the balanced tuning control signal within a range that is wide enough to accept expected frequency variations of the input data signal and drift of the voltage-controlled oscillator.

12. A phase-lock loop, in accordance with claim 11, wherein
the resistor further clamps the magnitude of the balanced tuning control signal within a range which assures that the phase-lock loop acquires lock only at acceptable frequencies.

* * * * *